United States Patent [19]

Proebsting

[11] Patent Number: 4,714,840
[45] Date of Patent: Dec. 22, 1987

[54] MOS TRANSISTOR CIRCUITS HAVING MATCHED CHANNEL WIDTH AND LENGTH DIMENSIONS

[75] Inventor: Robert J. Proebsting, Plano, Tex.

[73] Assignee: Thomson Components - Mostek Corporation, Carrollton, Tex.

[21] Appl. No.: 454,778

[22] Filed: Dec. 30, 1982

[51] Int. Cl.⁴ .......................................... H03K 17/687
[52] U.S. Cl. .................................. 307/443; 307/448; 307/584; 307/304
[58] Field of Search ............... 307/443, 448, 450, 577, 307/584, 303, 304, 501; 357/23, 41; 330/277

[56] References Cited
U.S. PATENT DOCUMENTS

| 3,652,906 | 3/1972 | Christensen | 307/450 X |
| 3,675,143 | 7/1972 | Greene | 330/277 |
| 3,845,324 | 10/1974 | Feucht | 307/448 |
| 3,898,477 | 8/1975 | Buchanan | 307/448 |
| 4,016,431 | 4/1977 | Henle et al. | 307/475 |
| 4,042,839 | 8/1977 | Araki | 307/450 |
| 4,199,695 | 4/1980 | Cook et al. | 307/482 X |
| 4,430,583 | 2/1984 | Shoji | 307/448 |

Primary Examiner—Stanley D. Miller
Assistant Examiner—D. R. Hudspeth
Attorney, Agent, or Firm—Roland Plottel

[57] ABSTRACT

The voltage gain of an MOS transistor inverter stage is made independent of the device threshold voltages and of channel lengths by making the length and width of the channel region of the upper load transistor equal to the length and width of the channel region of the lower driver transistor.

1 Claim, 2 Drawing Figures

MOS TRANSISTOR CIRCUITS HAVING MATCHED CHANNEL WIDTH AND LENGTH DIMENSIONS

This application relates to the field of electronic circuits, and in particular to MOS transistor circuits.

BACKGROUND OF THE INVENTION

A basic integrated MOS transistor circuit is the inverter circuit consisting of an upper MOS transistor connected between a supply voltage and an output terminal and a lower MOS transistor connected between the output terminal and ground. The gate of the upper transistor is connected to a reference voltage, commonly the supply voltage if the transistor is an enhancement type device, and the gate of the lower transistor is connected to an input signal.

In such circuits the width to length ratios of the channel regions of the MOS transistors are principal factors in determining the transconductances of the individual transistors. Conventionally the width to length ratio (W/L) of the upper or load transistor has been set to a relatively low value while the W/L ratio of the lower or driver transistor has been set to a relatively high value to establish voltage gain in the inverter stage.

The low logic level is typically below the threshold voltage of the lower driver transistor such that it is non-conductive and the upper load transistor brings the output to a high voltage. When the input is at a high voltage, the much more conductive driver transistor overpowers the load transistor bringing the output to a low voltage.

As will be shown in more detail later, the gain of an MOS transistor depends also on its channel length. More specifically if an MOS transistor is operating in saturation (i.e. the drain current is essentially independent of drain voltage) and if the length of the channel region between the source and drain areas is relatively short, the transistor tends to operate in a linear fashion, i.e. the drain current is proportional to the gate to source voltage less the transistor threshold voltage. However for devices which have a long channel region, the drain current is proportional to the square of the gate to source voltage less the transistor threshold voltge. For devices having a channel length in between, the drain current is proportional to something between linear and the square of the gate to source voltage less the transistor threshold voltage.

Thus a circuit designer must be aware of the actual length of a MOS channel region which will be used when designing an inverter circuit that has a relatively small voltage signal on the input, particularly when the low input level is above the threshold of the driver transistor. Moreover such a circuit when once designed is not amenable to being scaled larger or smaller to operate in another integrated circuit due to the changes in the nature of the transistor characteristics which are caused by changes in the channel length. This problem is especially acute in special purpose circuits such as an interface circuit designed to receive TTL input signals. A designer would generally want a threshold voltage of about 1.2 volts to make a TTL compatable input inverter stage whereas generally the threshold voltge of the MOS transistors are about half a volt for circuits designed to operate from a 5 volt supply. Thus the input transistor for the TTL signals would require a special threshold adjustment operation in the manufacturing process if a standard inverter is to be used and is to work properly even if the circuit dimensions are changed.

Thus it can be appreciated that an MOS inverter circuit which is not sensitive to variations in channel length and threshold voltages of the MOS transistors is highly desirable.

SUMMARY OF THE INVENTION

It is therefore the object of this invention to provide an inverting circuit which has an output to input voltage transfer characteristic which is relatively independent of channel length and threshold voltage of the MOS transistors.

It is also an object of this invention to provide a circuit for amplifying an input signal which is essentially independent of device channel length and threshold voltage.

It is also an object of this invention to provide a differential amplifier which has an output to input voltage characteristic which is essentially independent of the device channel length and threshold voltage.

Shown in an illustrated embodiment of the invention is an inverter circuit characterized in that the lengths of both transistors are equal to each other, as are the widths of both transistors.

Also shown in the illustrated embodiments is a differential amplifier having an upper transistor in which the gate is connected to one input, and a lower transistor in which the gate is connected to the second input and wherein the widths and lengths of both devices are equal to those of the other.

A method is shown in the preferred embodiments for achieving a stable gain of a MOS transistor amplifier stage which includes the step of first providing an upper MOS transistor which has a gate terminal and a drain terminal connected to a reference voltage. Additionally provided is a lower MOS transistor which has a gate terminal connected to an input signal, a source terminal connected to a ground potential and a drain terminal connected to the source terminal of the upper transistor and to an output terminal. The widths of the channel regions are selected to be equal for both devices, as are the lengths.

BRIEF DESCRIPTION OF THE DRAWINGS

The aforementioned and other features, characteristics, advantages, and the invention in general, will be better understood from the following more detailed description taken in conjunction with the accompanying drawings in which.

It will be appreciated that for simplicity and clarity of explanation and where considered appropriate, referenced numbers have been repeated in more than one figure to indicate corresponding features.

DETAILED DESCRIPTION

Figure 1:
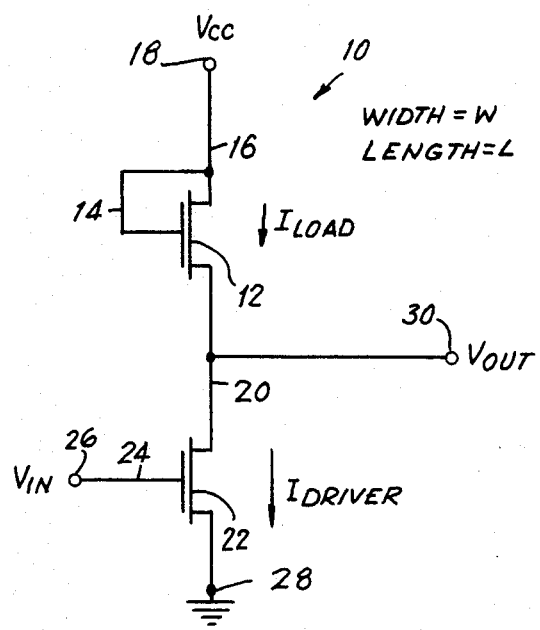
FIG. 1 is a schematic diagram of an inverter according to the present invention.

Referring now to the drawings, an inverter circuit according to the present invention is shown generally as reference numberal 10 in FIG. 1. An upper load MOS transistor 12 has a gate terminal 14 and a drain terminal 16 both connected to a supply voltage $V_{cc}$ at terminal 18. A source terminal of upper transistor 12 is connected to a node 20. A lower or driver MOS transistor 22 has a gate terminal 24 connected to an input signal at terminal 26. The source terminal of transistor 22 is connected to circuit ground at node 28 and the drain terminal of transistor 22 is connected to node 20 which in turn is connected to an output terminal 30.

In steady state operation the drain current through transistor 12 is equal to the drain current of transistor 22 assuming that there is not a significant amount of current flowing in or out of the output terminal 30. If the MOS transistors have short channel lengths and are therefore linear as described above, then the saturated drain current will be equal to a constant, K, times the width to length ratio of the transistor channel region, W/L, times the expression: the gate voltge $V_g$ minus the source voltage $V_s$ minus the threshold, $V_t$. This is shown below:

$$I_d = K_1(W/L)(V_g - V_s - V_t) \tag{1}$$

For transistor 12 the source voltage is equal to $V_{out}$ and the gate voltage is $V_{cc}$, and thus equation 1 becomes:

$$I_{load} = K_1(W/L)_L(V_{cc} - V_{out} - V_t) \tag{2}$$

and for driver transistor 22, the gate voltage becomes $V_{in}$ and the source voltage becomes ground or 0 volts:

$$I_{driver} = K_1(W/L)_d(V_{in} - 0 - V_t) \tag{3}$$

Making the equations 2 and 3 equal to each other one arrives at:

$$K_1(W/L)_d(V_{in} - 0 - V_t) = K_1(W/L)_L(V_{cc} - V_O - V_t) \tag{4}$$

and solving for $V_{out}$:

$$V_o = V_{cc} - V_t - \frac{(W/L)_d}{(W/L)_L}(V_{in} - V_t) \tag{5}$$

However if transistors 12 and 22 are operating in a square law manner as described above, then the equation for the saturated drain current becomes $$I_d = K_2(W/L)(V_g - V_s - V_t)^2 \tag{6}$$

and for devices 12 and 22 Id becomes $$I_{load} = K_2(W/L)_L(V_{cc} - V_{out} - V_t)^2 \tag{7}$$

$$I_{driver} = K_2(W/L)_d(V_{in} - 0 - V_t)^2 \tag{8}$$

solving for $V_{out}$:

$$K_2(W/L)_d(V_{in} - V_t)^2 = K_2(W/L)_L(V_{cc} - V_{out} - V_t)^2 \tag{9}$$

$$V_{out} = V_{cc} - V_t - \sqrt{\frac{(W/L)_d}{(W/L)_L}}(V_{in} - V_t) \tag{10}$$

Clearly, the expression for the output voltage for the linear device (equation 5) and the output voltage for the square law device (equation 10) have some differences in their terms, thus providing different gains from the amplifier stage depending on the length of the channel region. And for either equation to apply, both transistors must have similar characteristics, either linear or square law or something in between, which means both transistors must have the same channel lengths.

The problems associated with the differences between equations 5 and 10 can be overcome by a very special case in which the width to length ratio of the channel region of the upper transistor is fabricated to be identical to that of the lower transistor. This requirement coupled with the previous requirement that both have the same channel length requires both to be identical in both dimensions.

If the width of the upper transistor 12 is made equal to the width of the lower transistor 22 and the length of the upper transistor 12 is made equal to the length of the lower transistor 22, then and only then equations 5 and 10 become equal to each other:

$$V_{out} = V_{cc} - V_{in} \tag{11}$$

Moreover, the threshold voltage term has cancelled out. Thus the resulting inverter circuit has a voltage gain of minus one and is independent of the length of the channel region or the threshold voltage of the MOS transistors. For any other configuration, the output voltage would be a function of not only the input voltage but also of the device threshold voltage and channel length, even if the thresholds and channel lengths are equal to each other.

It will be appreciated by those skilled in the art that regardless of the device characteristics of the transistors, as long as both transistors are in saturation, i.e. operating in a range in which the drain to source current is independent of the drain to source voltage, and as long as the device characteristics of the load transistor are identical to those of the driver transistor, then the gate to source voltage of the load transistor must be equal to the gate to source voltage of the driver transistor since both transistors have the same current. This leads to equation 11 for any transistor characteristics as long as the driver and load transistor characteristics are identical to each other.

Figure 2:
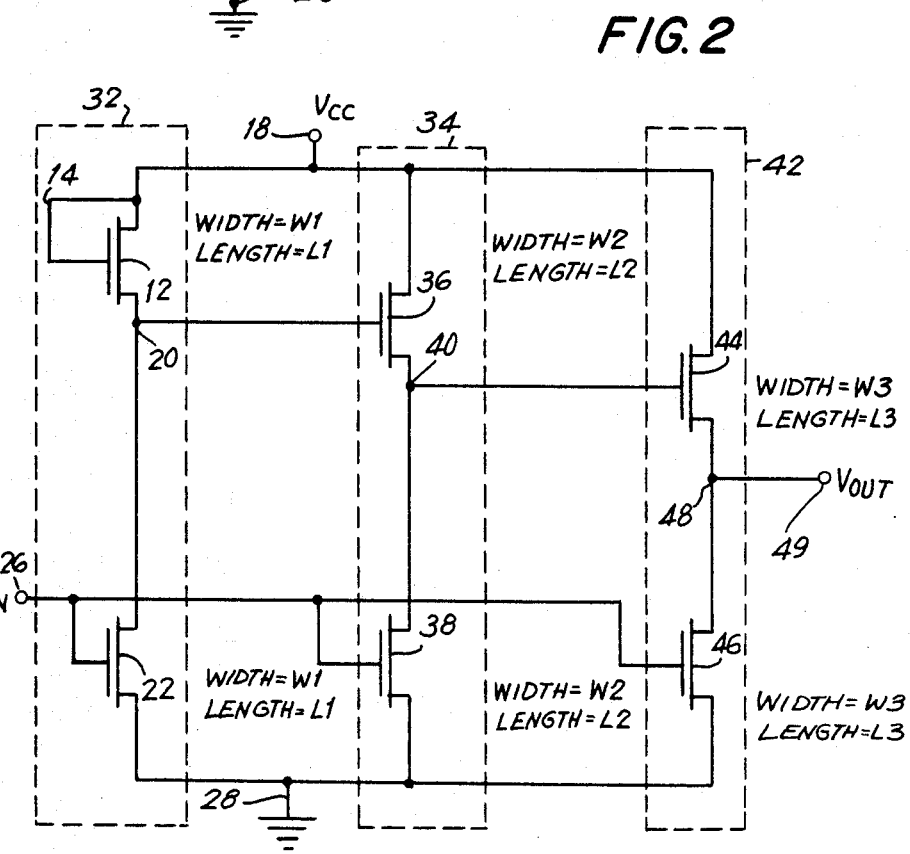
FIG. 2 is a schematic diagram of an MOS amplifier circuit in accordance with the present invention.

Turning now to FIG. 2, a three stage MOS circuit is shown in which a first stage 32 is comprised of the circuit of FIG. 1 and a second stage 34 contains two transistors, an upper transistor 36 and a lower transistor 38 and which has a output at a node 40 connected to the input of a third stage 42. Stage 42 is comprised of an upper transistor 44 and a lower transistor 46 which are connected together at a node 48 which in turn is connected to an output terminal 49. Transistors 38 and 46 both have their gate terminals connected to the input terminal 26 and their source terminals connected to the ground potential at terminal 28. The drain terminals of transistors 36 and 44 are connected to the VCC terminal 18. The gate terminal of transistor 36 is connected to the node 20 of the first stage while the gate terminal of transistor 44 is connected to node 40 of the second stage circuit 34. The source terminal of transistor 36 is connected to the drain terminal of transistor 38 and to node 40 while the source terminal of transistor 44 is connected to the drain terminal of transistor 46 and to node 48. The width of transistors 12 and 22 are equal to each other and the lengths of transistors 12 and 22 are equal to each other. Likewise transistors 36 and 38 are equal to each other in both width and length but not necessarily equal to the width or length of transistors 12 and 22. Also transistors 44 and 46 are equal to each other in both width and length but not necessarily equal in width or length to transistors 12 and 22 or 36 and 38.

The operation of the circuit of FIG. 2 is best described by applying the appropriate equations to each of the three stages. In particular the voltage output of the first stage at node 20 will be equal to $V_{cc}-V_{in}$ as given by equation 11. Note that Vcc in this expression comes from the gate voltage of the load transistor. This voltage on node 20 could have been expressed as the load transistor gate voltage minus the input voltage. The voltage output of the second stage 34 at node 40 is then:

$$V_{out2}=V_{g2}-V_{in} \quad (12)$$

Since $V_{g2}$ is the $V_{out}$ of the first stage which is $V_{cc}-V_{in}$ $$V_{out2}=(V_{cc}-V_{in})-V_{in}=V_{cc}-2V_{in} \quad (13)$$

Similarly the voltage output of the third stage 42 will be equal to:

$$V_{out3}=V_{g3}-V_{in}=(V_{cc}-2V_{in})-V_{in}=V_{cc}-3V_{in} \quad (14)$$

Thus the circuit in FIG. 2 provides an amplification factor of minus three of an input signal and the circuit operation is essentially independent of the threshold voltage and independent of the channel length of the devices.

This equation holds when the geometries of the transistors in integrated circuits are shrunk or expanded or when the threshold voltage is changed. A fixed equation does not exist for any inverter configuration other than one in which all geometries of the upper and lower transistors of any given stage are equal to those of each other. This equation holds as long as all transistors are conductive (i.e. input above $V_t$) and all transistors are in saturation (i.e. output above $V_{in}-V_t$).

Note that stages 34 and 42 act as differential amplifiers since the output signal of nodes 40 and 48 respectively are the voltage difference of the signals appearing at the gates of the upper transistors minus the voltage at the gate of the lower transistors.

Although the invention has been described in part by making detailed reference to certain specific embodiments, such details are intended to be, and will be understood to be, instructive rather than restrictive. It will be appreciated by those in the art that many variations may be made in the structure and mode of operation without departing from the scope and spirit of the invention as described in the teachings contained herein.

I claim:

1. A circuit arrangement including first and second voltage supply terminals between which the voltage supply is to be applied, an input terminal to which an input signal is to be applied, and an output terminal at which an output signal is to be derived, and first, second and third amplifier stages,
   each stage including a driver transistor and a load transistor,
   each transistor being of the enhancement node type and including a source and a drain spaced by a channel and an insulated gate overlying the channel,
   the drive and load transistors of each stage having equal channel lenghts and widths, in each stage the source of the driver transistor being connected to the first voltage supply terminal, the drain of the driver transistor being connected to the source of the load transistor at a source-drain node, the drain of the load transistor being connected to the second voltage supply terminal, and the gate of the driver transistor being connected to the input terminal,
   in the first stage, the gate of the load transistor being connected to the drain of the load transistor,
   in the second stage, the gate of the load transistor being connected to the source-drain node of the first stage,
   in the third stage, the gate of the load transistor being connected to the source-drain node of the second stage, and
   the source-drain node of the third stage being connected to the output terminal.

* * * * *